(12) United States Patent
Liu

(10) Patent No.: US 10,522,612 B1
(45) Date of Patent: Dec. 31, 2019

(54) FIXING STRUCTURE AND ELECTRONIC DISPLAYING APPARATUS THEREWITH

(71) Applicant: Wistron Corporation, New Taipei (TW)

(72) Inventor: Wei-Lun Liu, New Taipei (TW)

(73) Assignee: Wistron Corporation, New Taipei (TW)

( * ) Notice: Subject to any disclaimer, the term of this patent is extended or adjusted under 35 U.S.C. 154(b) by 0 days.

(21) Appl. No.: 16/250,997

(22) Filed: Jan. 17, 2019

(30) Foreign Application Priority Data

Sep. 28, 2018 (TW) .............................. 107134231 A

(51) Int. Cl.
| | | |
|---|---|---|
| *H01L 27/32* | (2006.01) | |
| *H05K 5/02* | (2006.01) | |
| *H05K 7/12* | (2006.01) | |
| *H05K 5/00* | (2006.01) | |

(52) U.S. Cl.
CPC ....... *H01L 27/3297* (2013.01); *H05K 5/0017* (2013.01); *H05K 5/0247* (2013.01); *H05K 7/12* (2013.01)

(58) Field of Classification Search
None
See application file for complete search history.

(56) References Cited

U.S. PATENT DOCUMENTS 6,383,013 B1 * 5/2002 Ghesla .................. G01D 11/24
439/408

FOREIGN PATENT DOCUMENTS

| CN | 104165259 | 3/2016 |
|---|---|---|
| CN | 206059710 U | 3/2017 |
| TW | 200830236 | 7/2008 |
| TW | 201002974 | 1/2010 |
| TW | I612815 B | 1/2018 |
| WO | 2016058196 | 4/2016 |

* cited by examiner

*Primary Examiner* — Xanthia C Cunningham
(74) *Attorney, Agent, or Firm* — Winston Hsu

(57) ABSTRACT

The invention discloses a fixing structure and an electronic displaying apparatus therewith. The electronic displaying apparatus includes an apparatus body and a fixing device. The fixing device pierces an electrical wire through a piercing structure and the fixing device is fixed on the apparatus body, so that the apparatus body and the electrical wire are electrically connected. Thereby, the electrical wire can provide both supporting force and power to the apparatus body through the fixing device.

20 Claims, 10 Drawing Sheets

FIXING STRUCTURE AND ELECTRONIC DISPLAYING APPARATUS THEREWITH

BACKGROUND OF THE INVENTION

1. Field of the Invention

The present invention relates to an electronic displaying apparatus, and more particularly to a fixing structure for an electronic displaying apparatus.

2. Description of the Prior Art

Digital photo frames can switch different pictures to be displayed on the same screen and therefore are used widely for replacing conventional photo frames. For the disposition of the digital photo frames, the digital photo frames can be supported by a simple support on a table, be attached onto a wall through a bracket or a hanger, or hang through wires. If the digital photo frame needs external power, a power cable is required to connect with the digital photo frame. However, the power cable and the digital photo frame are connected through wire end terminals and a terminal block, so that it is inconvenient to adjust the hang height of the digital photo frame because of a fixed length of the power cable.

SUMMARY OF THE INVENTION

The present disclosure provides a fixing structure, which can provide both mechanical and electrical connection so that an electrical wire that is attached to the fixing structure can provide supporting force and power to a device on which the fixing structure is attached.

A fixing structure according to an embodiment is used for an electronic displaying apparatus. The fixing structure includes a fixing device. The fixing device pierces the electrical wire through a piercing structure. The fixing device is fixed on the electronic displaying apparatus, so that the electronic displaying apparatus and the electrical wire are electrically connected. Thereby, the electrical wire can provide supporting force and power to the electronic displaying apparatus through the fixing device. Furthermore, the height of the electronic displaying apparatus supported by the electrical wire can be changed by adjusting the fixing device.

The present disclosure also provides an electronic displaying apparatus which has the above fixing structure. Therein, the electronic displaying apparatus has an apparatus body that has a display screen. Therefore, the apparatus body obtains supporting force and power through the electrical wire. The height of the apparatus body supported by the electrical wire can be changed by adjusting the fixing device.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
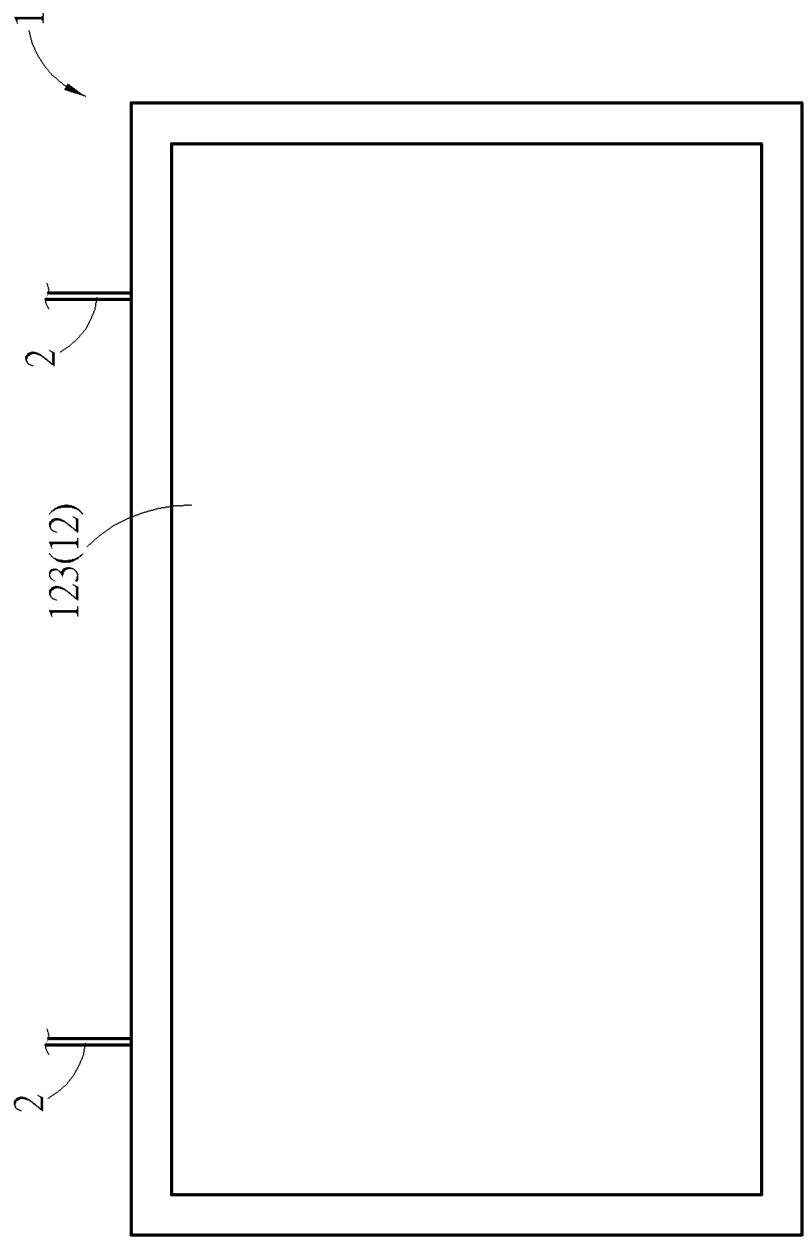
FIG. 1 is a schematic diagram illustrating a front side of an electronic displaying apparatus according to an embodiment.
Figure 2:
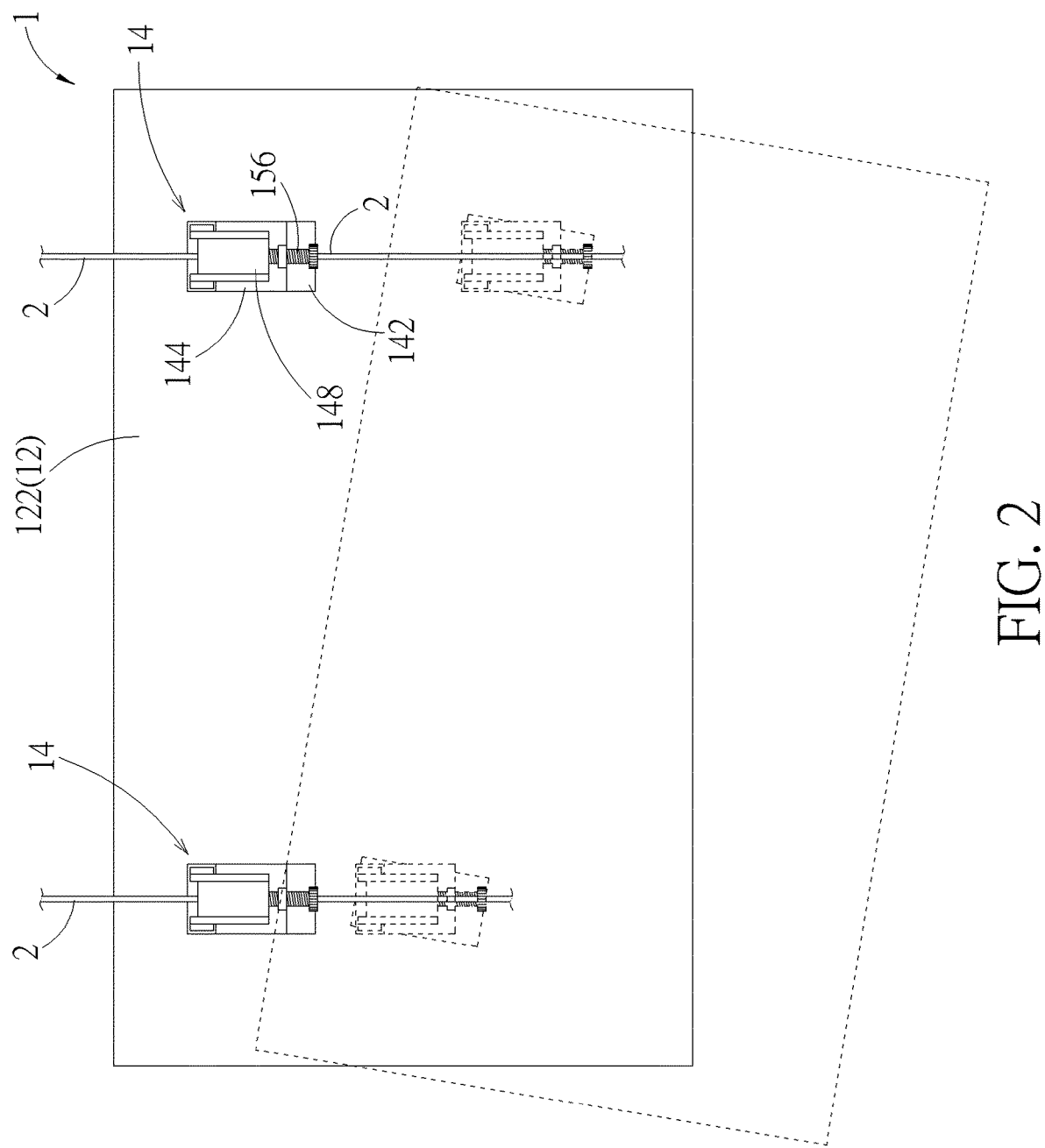
FIG. 2 is a schematic diagram illustrating a back side of the electronic displaying apparatus.

Please refer to FIG. 1 and FIG. 2. An electronic displaying apparatus 1 according to an embodiment includes an apparatus body 12 and two fixing devices 14. The fixing device 14 is fixed onto the apparatus body 12. Each fixing device 14 fixes an electrical wire 2 so that the electronic displaying apparatus 1 can be hung through the two electrical wires 2. Besides, the fixing device 14 also performs electrical connection. Thereby, the electrical wires 2 are electrically connected to the apparatus body 12 through the fixing device 14 so as to provide required power to the apparatus body 12. Therein, the arrangement by which the electrical wires 2 are connected to the apparatus body 12 through the fixing device 14 forms a fixing structure of the electronic displaying apparatus 1. Furthermore, the fixing device 14 is usually attached to a back casing 122 of the apparatus body 12 (i.e. the back side thereof). The apparatus body 12 has a display screen 123 at its front side, for displaying pictures. In practice, the electronic displaying apparatus 1 can be a digital photo frame or other device capable of displaying pictures thereon, e.g. tablet computers.

Please also refer to FIG. 3 to FIG. 6. The fixing device 14 includes a fixed part 142, a movable part 144, a connecting mechanism 146, a clamping part 148, an electrical input terminal 150, and an electrical output terminal 152. The fixed part 142 is fixed on the apparatus body 12, for example but not limited to by fastening on the back casing 122 of the apparatus body 12 with two screws 143, by directly gluing, or by engaging structures (e.g. hooks engaging with slots or holes). For another example, the fixed part 142 and the back casing 122 are formed in a mono-structure (e.g. by injection molding). The connecting mechanism 146 includes a slot 1462 and a sliding part 1464 slidably disposed on the slot 1462. The slot 1462 extends along an extension direction 1462a (indicated by a double-headed arrow in FIG. 4). Thereby, the slot 1462 and the sliding part 1464 can relatively slide. In the embodiment, the slot 1462 is disposed on the movable part 144. The sliding part 1464 is disposed on the fixed part 142 correspondingly. Thereby, the movable part 144 and the fixed part 142 can relatively slide through the connecting mechanism 146. Similarly, in practice, the slot 1462 can be changed to be disposed on the fixed part 142 while the sliding part 1464 is disposed on the movable part 144, which also can perform relatively sliding. In the embodiment, the slot 1462 is realized by a long through slot of the movable part 144. The sliding part 1464 has a T-shaped profile and is fixed to the fixed part 142. In practice, the sliding part 1464 can be realized by a bolt and is fastened to the fixed part 142. A portion of the bolt without threads slides in the slot 1462. The head of the bolt is located at a side of the slot 1462 opposite to the fixed part 142 so that the sliding part 1464 and the slot 1462 can stably relatively slide. For another example, the sliding part 1464 can be realized by a round pin having a T-shaped profile in a longitudinal direction. An end of the round pin is fixed on the fixed part 142 (e.g. by welding or interference fit, or by fastening with a screw engaging with an inner thread of the end). The other end of the round pin (i.e. the head thereof) is located at a side of the slot 1462 opposite to the fixed part 142 so that the sliding part 1464 and the slot 1462 can stably relatively slide. For another example, the sliding part 1464 and the fixed part 142 are formed in a mono-structure (e.g. by machining the same workpiece). Correspondingly, the slot 1462 is a sectional or unclosed slot in practice, so as to facilitate the assembly with the sliding part 1464, which will not be described further. For another example, the sliding part 1464 can be realized by a slider and a post connected to the slider. The slider slides in the slot 1462. The post is fixed to the fixed part 142.

Figure 3:
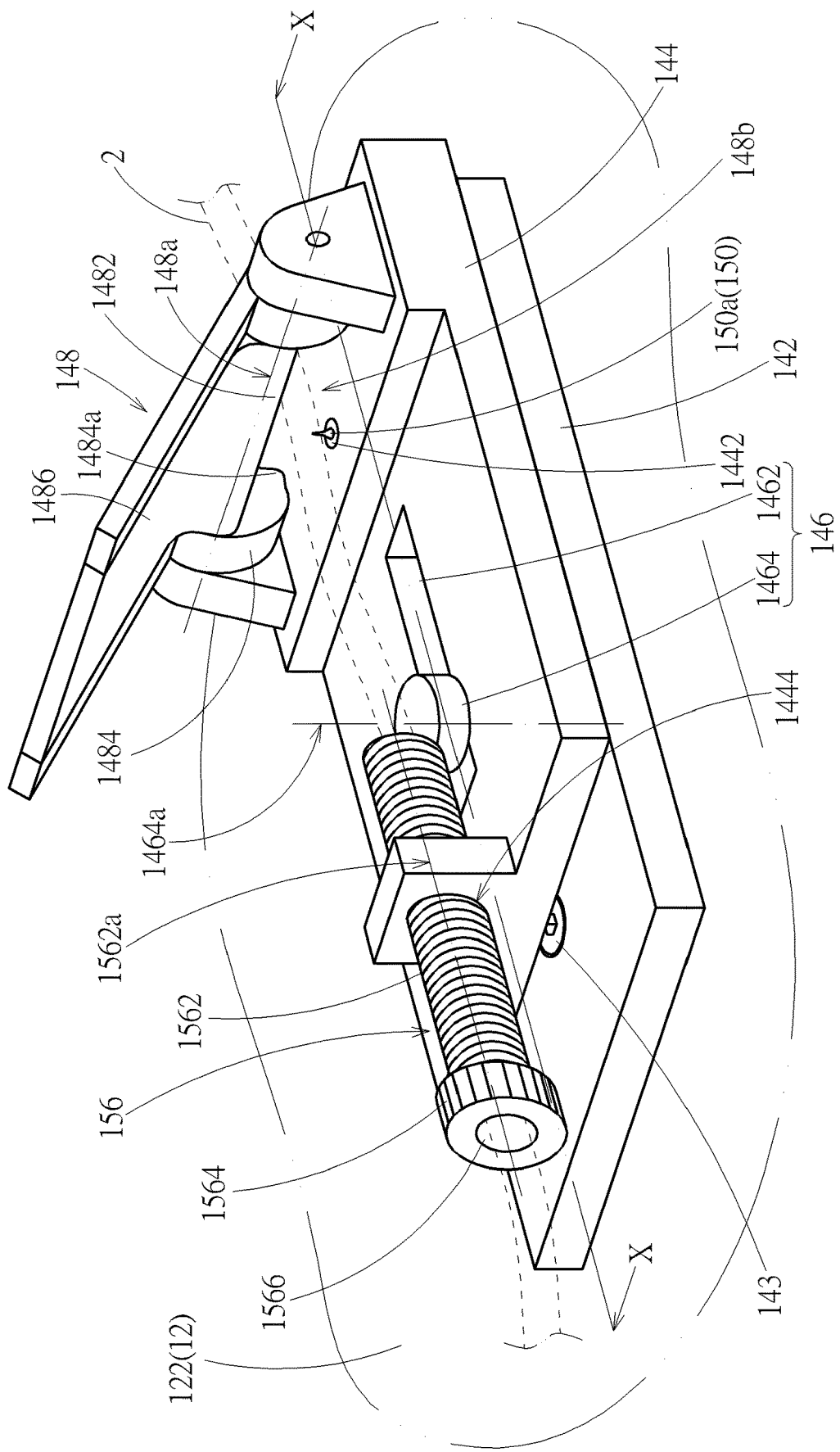
FIG. 3 is a schematic diagram illustrating a fixing device of the electronic displaying apparatus in FIG. 2.
Figure 4:
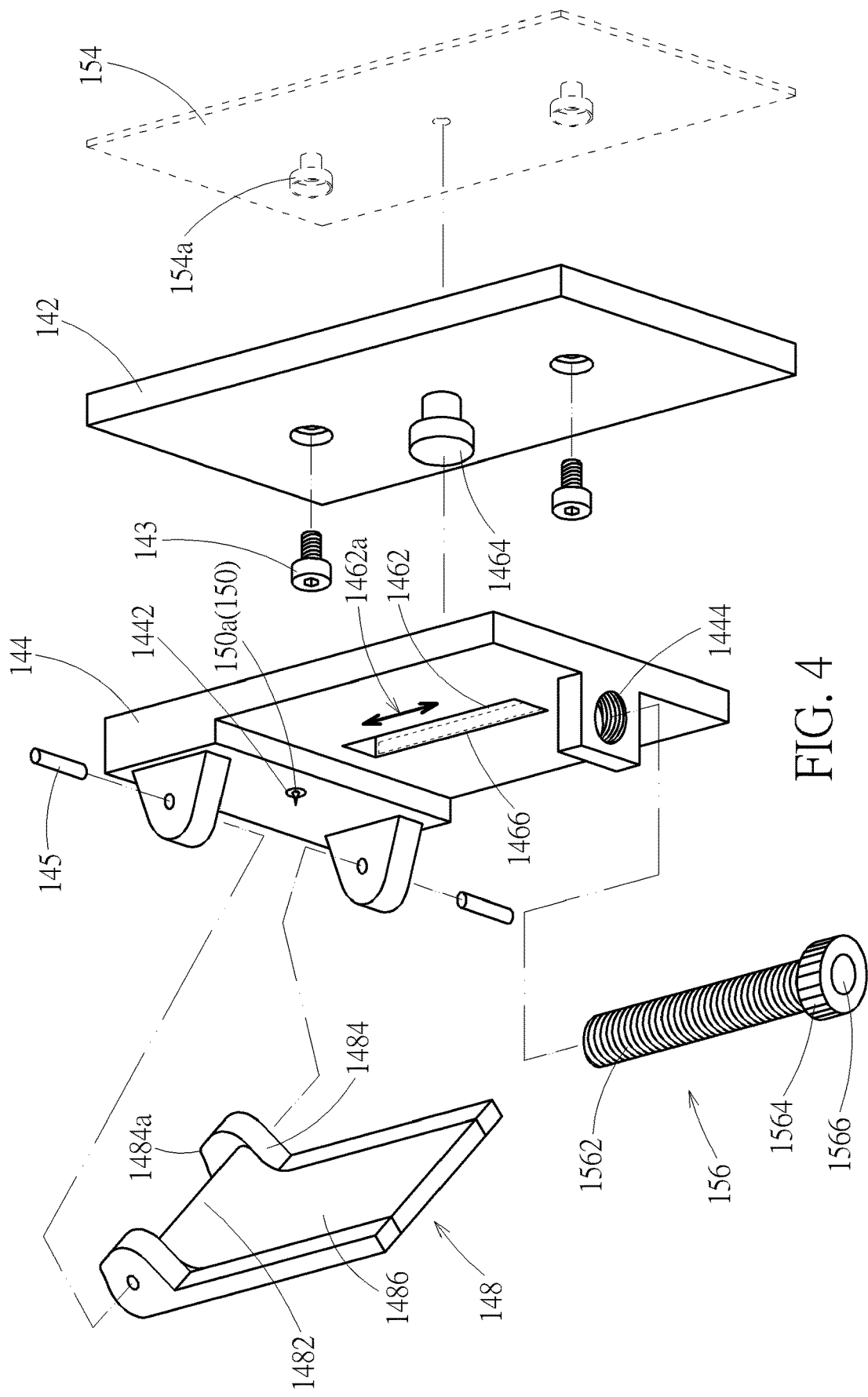
FIG. 4 is an exploded view of the fixing device in FIG. 3.
Figure 5:
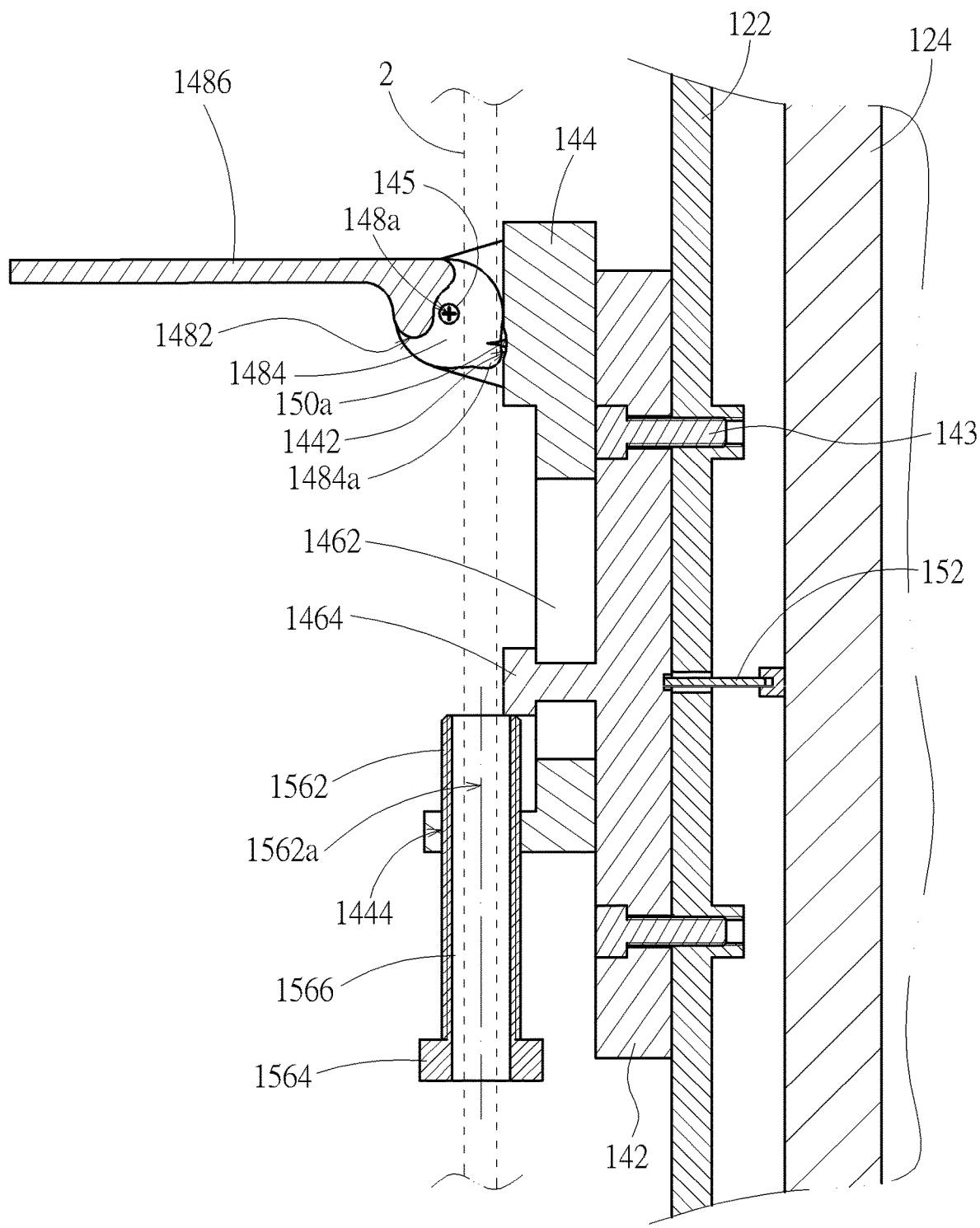
FIG. 5 is a sectional view of the fixing device along the line X-X in FIG. 3.
Figure 6:
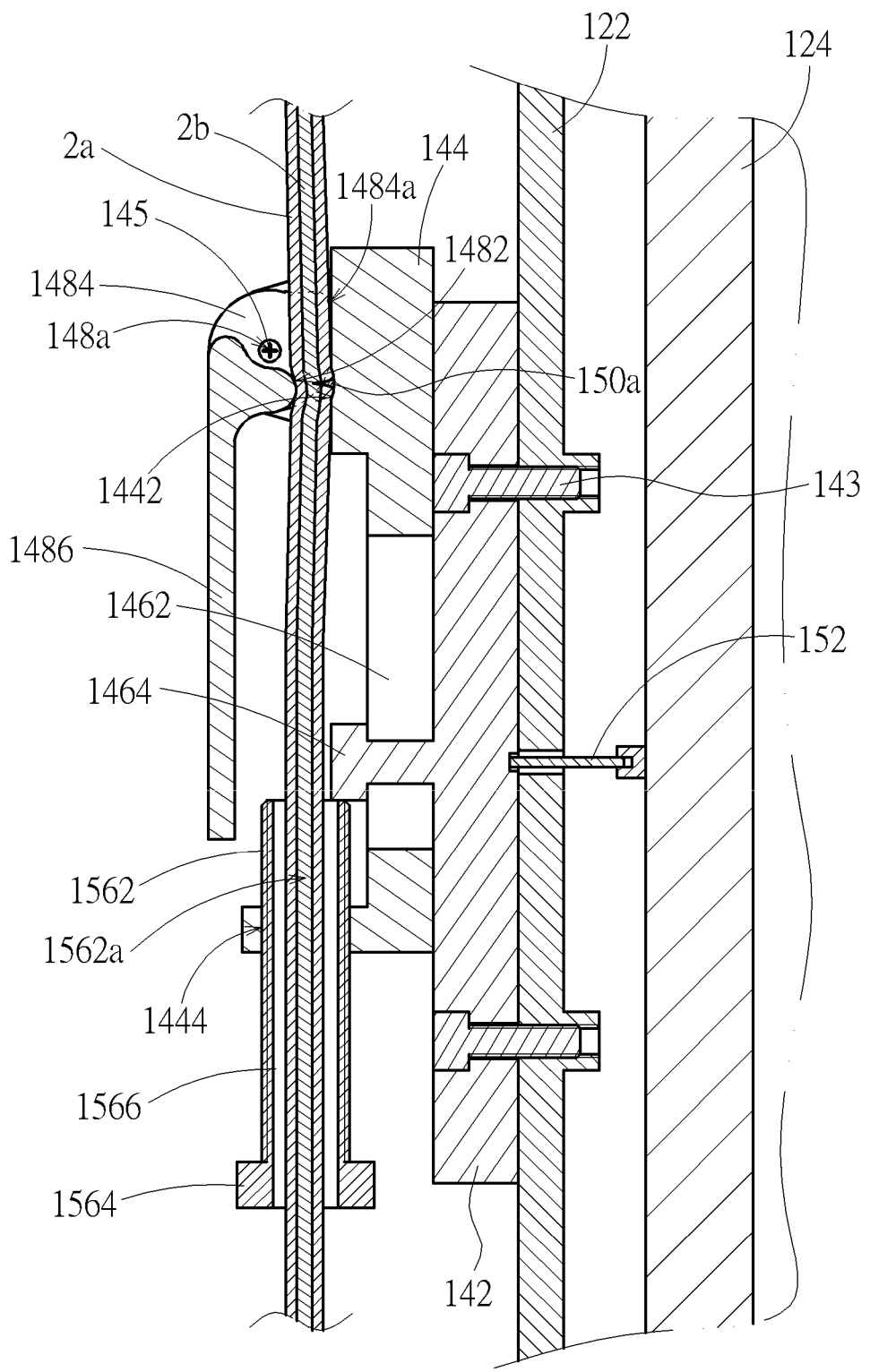
FIG. 6 is a sectional view of the fixing device in FIG. 5 on which an electrical wire is attached.

In the embodiment, the clamping part 148 is pivotally connected with the movable part 144 relative to a pivotal axis 148*a* (indicated by a chain line in FIG. 3 and by a cross mark in FIG. 5 and FIG. 6). The clamping part 148 has a pressing surface 1482. The pressing surface 1482 faces the movable part 144. The pressing surface 1482 and the movable part 144 form a channel 148*b*. The electrical input terminal 150 is disposed on the movable part 144 and includes a piercing structure 150*a*. The piercing structure 150*a* is faces the pressing surface 1482. The electrical output terminal 152 is disposed on the fixed part 142 and is electrically connected with the electrical input terminal 150 and the apparatus body 12. For simplification of drawings, the electrical output terminal 152 is shown by a round post that is inserted into a circuit board module 124 of the apparatus body 12. In practice, the electrical connection of the electrical output terminal 152 and the apparatus body 12 can be implemented by connecting two mating connectors, by an electrical wire (e.g. the electrical output terminal 152 being an electrical wire, of which one end is soldered to the fixed part 142, of which the other end is fastened with a wire end terminal onto the inside of the apparatus body 12), by a pair of metal resilient strips that are disposed oppositely and resiliently contact with each other, or by other ways of electrically connecting. In the embodiment, the distance between the pressing surface 1482 and the movable part 144 (or the piercing structure 150*a*) varies as the clamping part 148 rotates relative to the movable part 144. For example, as shown by FIG. 5, the clamping part 148 is located at a loose position relative to the movable part 144. For this situation, the electrical wire 2 (of which the profile is shown in dashed lines in FIG. 5) can pass through the channel 148*b* without damage. After the clamping part 148 rotates toward the movable part 144 (as shown by FIG. 6; therein, the clamping part 148 being located at a tight position relative to the movable part 144), the channel 148*b* becomes narrow so that the electrical wire 2 is pressed by the pressing surface 1482 to make the piercing structure 150*a* pierce an insulation jacket 2*a* of the electrical wire 2 to contact a center conductor 2*b* of the electrical wire 2, even pierce the center conductor 2*b*. At this time, the electrical wire 2 is clamped by the clamping part 148 and the movable part 144. The electrical wire 2 and the electrical input terminal 150 are electrically connected. That is, the electrical wire 2 is electrically connected to the apparatus body 12 through the electrical input terminal 150 and the electrical output terminal 152. In the embodiment, the two electrical wires 2 have insufficient strength so that the electronic displaying apparatus 1 can be supported by the electrical wires 2. A user can adjust the hang height of the electronic displaying apparatus 1 by changing the position of the electrical wire 2 which the fixing device 14 clamps. For example, the clamping part 148 is rotated to the loose position for loosing the electrical wire 2, and then is rotated again to the tight position for clamping the electrical wire 2. Furthermore, the apparatus body 12 can be disposed obliquely (as shown by dashed lines in FIG. 2) by the two fixing devices 14 clamping the electrical wires 2 at different heights.

Figure 7:
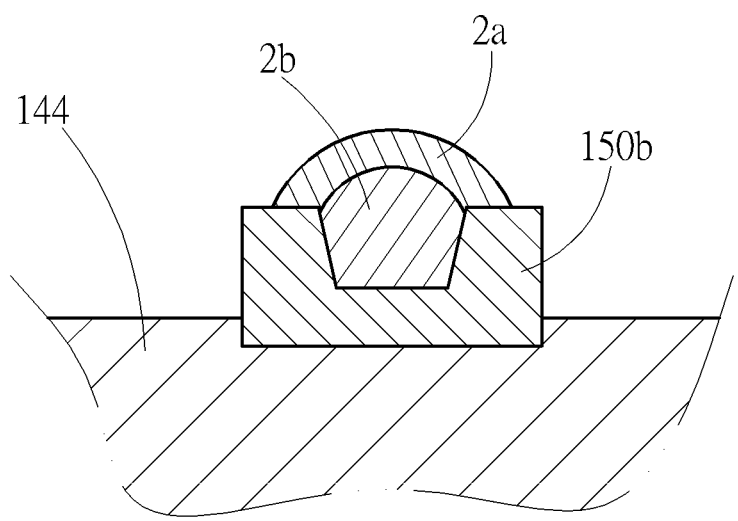
FIG. 7 is a sectional view of an electrical input terminal of the fixing device according to an embodiment.

Furthermore, in the embodiment, the piercing structure 150*a* is a conductive pointed end protruding out of the movable part 144 toward the pressing surface 1482. In practice, the piercing structure 150*a* can be changed to be a cutting edge 150*b* (as shown by FIG. 7, of which the view point is perpendicular to the extension direction of the electrical wire 2 which is shown with hatching, in which the dashed lines shown the profile of the portion of the insulation jacket 2*a* of the electrical wire 2 hidden by the cutting edge), or a combination of both, or other structures capable of piercing the insulation jacket 2*a* of the electrical wire 2. In the embodiment, for simplification of description, the fixed part 142, the movable part 144, the slot 1462, and the sliding part 1464 are made of metal. The sliding part 1464 electrically contacts the slot 1462. The electrical input terminal 150 and the electrical output terminal 152 are electrically fixed on the movable part 144 and the fixed part 142 respectively (for example but not limited to by welding or structurally fitting), so that the electrical input terminal 150 is electrically connected to the electrical output terminal 152 through the slot 1462 and the sliding part 1464. Therefore, when the electrical wire 2 is clamped by the fixing device 14, the center conductor 2*b* of the electrical wire 2 is electrically connected to the apparatus body 12 through the electrical input terminal 150, the movable part 144, the slot 1462, the sliding part 1464, the fixed part 142, and the electrical output terminal 152. In the embodiment, the two fixing devices 14 of the electronic displaying apparatus 1 are connected the two electrical wires 2 respectively. The two electrical wires 2 provide power to the apparatus body 12. In practice, the electrical wire 2 is not limited to provide power to the apparatus body 12. Furthermore, the embodiment is based on that the electrical wire 2 of a solid conductor. In practice, the fixing device 14 also can be properly modified (e.g. provided with conductive pointed ends, cutting edges, or a combination of both corresponding to the quantity of the cords of the electrical wire; therein, the conductive pointed ends, the cutting edges, or the combination of both are arranged in a direction perpendicular to the pivotal axis 148*a* for reducing structural interference) to be applied to a cable of multi-conductors, a coaxial cable, a flat cable, and so on, which will not be described. In addition, in practice, an insulation pad 154 (shown in dashed lines in FIG. 4) can be disposed between the fixed part 142 and the back casing 122 (of the apparatus body 12). Furthermore, the insulation pad 154 forms a cupped portion 154*a* corresponding to the screw 143, for insulating the screw 143 from the fixed part 142.

Furthermore, in practice, the connecting mechanism 146 can further includes two conductive resilient strips 1466 (shown by two long strips in dashed lines in FIG. 4) disposed on two side walls of the slot 1462 along the extension direction 1462*a* respectively. The sliding part 1464 electrically slidably contacts the conductive resilient strips 1466. The conductive resilient strip 1466 is resilient, so the sliding part 1464 can maintain contacting with the conductive resilient strips 1466 when sliding relative to the slot 1462, so that the electrical input terminal 150 is stably electrically connected to the electrical output terminal 152 through the conductive resilient strips 1466 and the sliding part 1464. In practice, it is also practicable to use one conductive resilient strip 1466 for obtaining the electrical and slidable contact of the sliding part 1464 with the conductive resilient strip 1466. Furthermore, in practice, the mechanical connection strength of the fixed part 142 and the movable part 144 can be provided mainly by the sliding part 1464 and the slot 1462. The contact of the sliding part 1464 with the conductive resilient strip 1466 can be used mainly for the electrical connection. The structure for this configuration can be realized by modifying the structure shown by FIG. 3 (for example by forming a step structure on the side walls of the slot 1462, so that the contact of the sliding part 1464 with the slot 1462 will not interfere with the resilient deformation of the conductive resilient strip 1466), which will not be described in addition. Furthermore, for this case, the electrical input terminal 150 and the conductive resilient strip 1466 can be electrically connected by an electrical wire. The sliding part 1464 and the electrical output terminal 152 also can be electrically connected by an electrical wire. The movable part 144 and the fixed part 142 are made of non-metal for increasing the manufacturing flexibility.

In the embodiment, the clamping part 148 is realized substantially by two rotation plates and a rotation pressing plate clamped by the two rotation plates. In logic, the clamping part 148 still can be regarded as to include a pivotal portion 1484 and a manipulation portion 1486 connected with the pivotal portion 1484. Therein, the pivotal portion 1484 is equivalent to the portions of the two rotation plates which are pivotally connected with the movable part 144. The manipulation portion 1486 is equivalent to the combination of the strip portions of the two rotation plates and the rotation pressing plate. In practice, the clamping part 148 also can be realized by several parts assembled in other joining ways, or by a single part, which will not be described in addition. In the embodiment, the pivotal portion 1484 is pivotally connected with the movable part 144 relative to the pivotal axis 148a, for example by two insertion pins 145. The pressing surface 1482 is located on the manipulation portion 1486. The pivotal portion 1484 has two protruding portions 1484a protruding perpendicular to the pivotal axis 148a. When the clamping part 148 rotates between the loose position (as shown by FIG. 5) and the tight position (as shown by FIG. 6), the protruding portion 1484a and the movable part 144 structurally interfere with each other. When a structural interference occurs, the engagement structures of the pivotal portion 1484 and the movable part 144 produce corresponding resilient deformation (for example, which is obtained by resiliently deforming of the structure itself). In other words, the protruding portion 1484a has an effect of retarding the rotation of the clamping part 148 relative to the movable part 144. In the embodiment, the protruding portion 1484a has a positioning effect of making the clamping part 148 stop at the tight position. Furthermore, the protruding portion 1484a is conducive to pressing of the pressing surface 1482 to the electrical wire 2, so that the electrical wire 2 can be clamped by the clamping part 148 and the movable part 144. In addition, in practice, the clamping part 148 also can be positioned at the tight position relative to the movable part 144 by other structures. For example, the manipulation portion 1486 is provided with an engaging structure (e.g. hooks or slots), for engaging with an engaging structure (e.g. hooks or slots) of the movable part 144 when the clamping part 148 is located at the tight position. In addition, in the embodiment, the clamping part 148 as a whole is structurally symmetric, however, which is not limited thereto in practice. For example, the clamping part 148 can be realized by a combination of a rotation plate and a pressing rotation plate.

Figure 8:
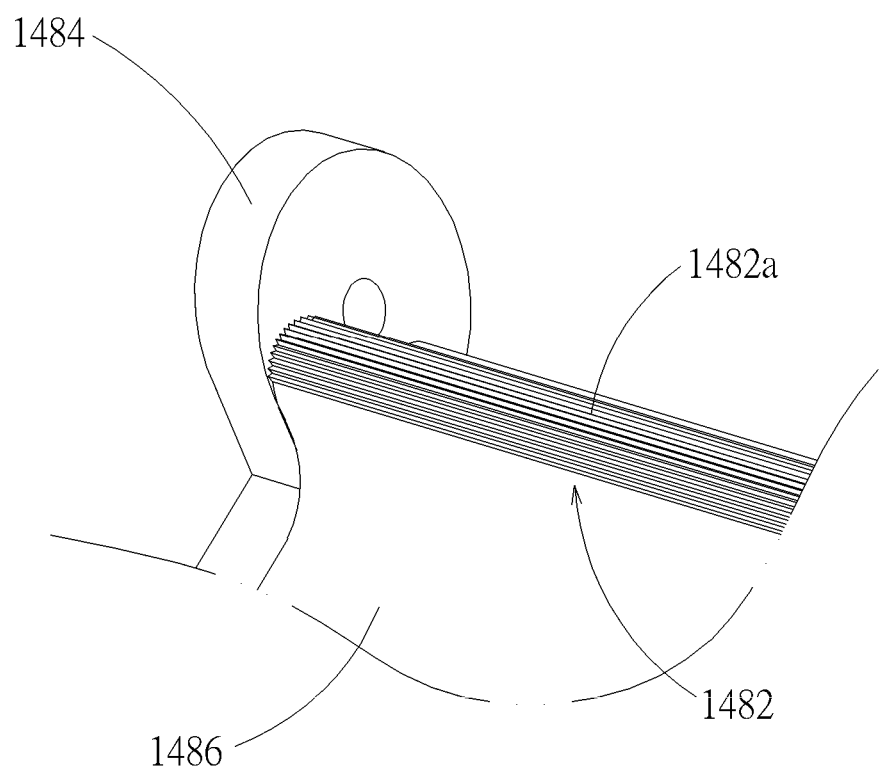
FIG. 8 is a schematic diagram illustrating a pressing surface of a clamping part of the fixing device according to an embodiment.
Figure 9:
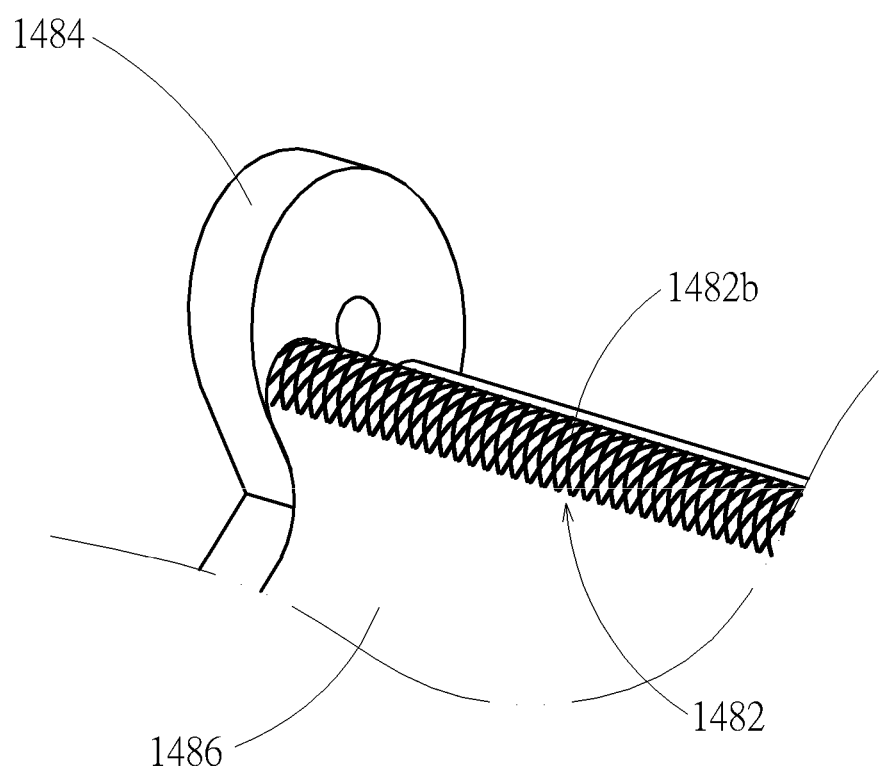
FIG. 9 is a schematic diagram illustrating the pressing surface of the clamping part of the fixing device according to another embodiment.

Furthermore, in the embodiment, the pressing surface 1482 protrudes toward the piercing structure 150a. As shown by FIG. 6, the protruding pressing surface 1482 is conducive to increasing the contact area of the clamping part 148 and the electrical wire 2 (or the insulation jacket 2a thereof) and is also conducive to increasing the degree of deformation (or bending) of the electrical wire 2 when the electrical wire 2 is clamped (by the clamping part 148 and the movable part 144). The both effects are conducive to retarding detachment of the electrical wire 2 from the fixing device 14. Furthermore, in the embodiment, the movable part 144 has a depression 1442 toward the pressing surface 1482. The piercing structure 150a is disposed in the depression 1442. When the electrical wire 2 is clamped, the electrical wire 2 is also sunk into the depression 1442. Therefore, the depression 1442 is also conducive to increasing the contact area of the movable part 144 and the electrical wire 2 (or the insulation jacket 2a thereof), which is also conducive to retarding detachment of the electrical wire 2 from the fixing device 14. In addition, in practice, the pressing surface 1482 can form a plurality of protrusions 1482a (e.g. grooves shown in FIG. 8 which extend parallel to the pivotal axis 148a, or convex pillars) or notches 1482b (e.g. as shown by bold lines in FIG. 9 by knurling, or pits) thereon, for increasing the contact area of the pressing surface 1482 and the electrical wire 2 (or the insulation jacket 2a thereof), which also can produce an effect of mutually embedding and is also conducive to retarding detachment of the electrical wire 2 from the fixing device 14. In addition, in the embodiment, the piercing structure 150a pierces the electrical wire 2 because of the pressing of the clamping part 148 to the electrical wire 2, however, which is not limited thereto in practice. For example, the fixing device 14 does not include the clamping part 148. The user can press the electrical wire 2 toward the piercing structure 150a by use of other tools or by hands, so as to make the piercing structure 150a pierce the electrical wire 2, which still can make the electrical wire 2 be able to provide supporting in a certain degree to the apparatus body 12.

Figure 10:
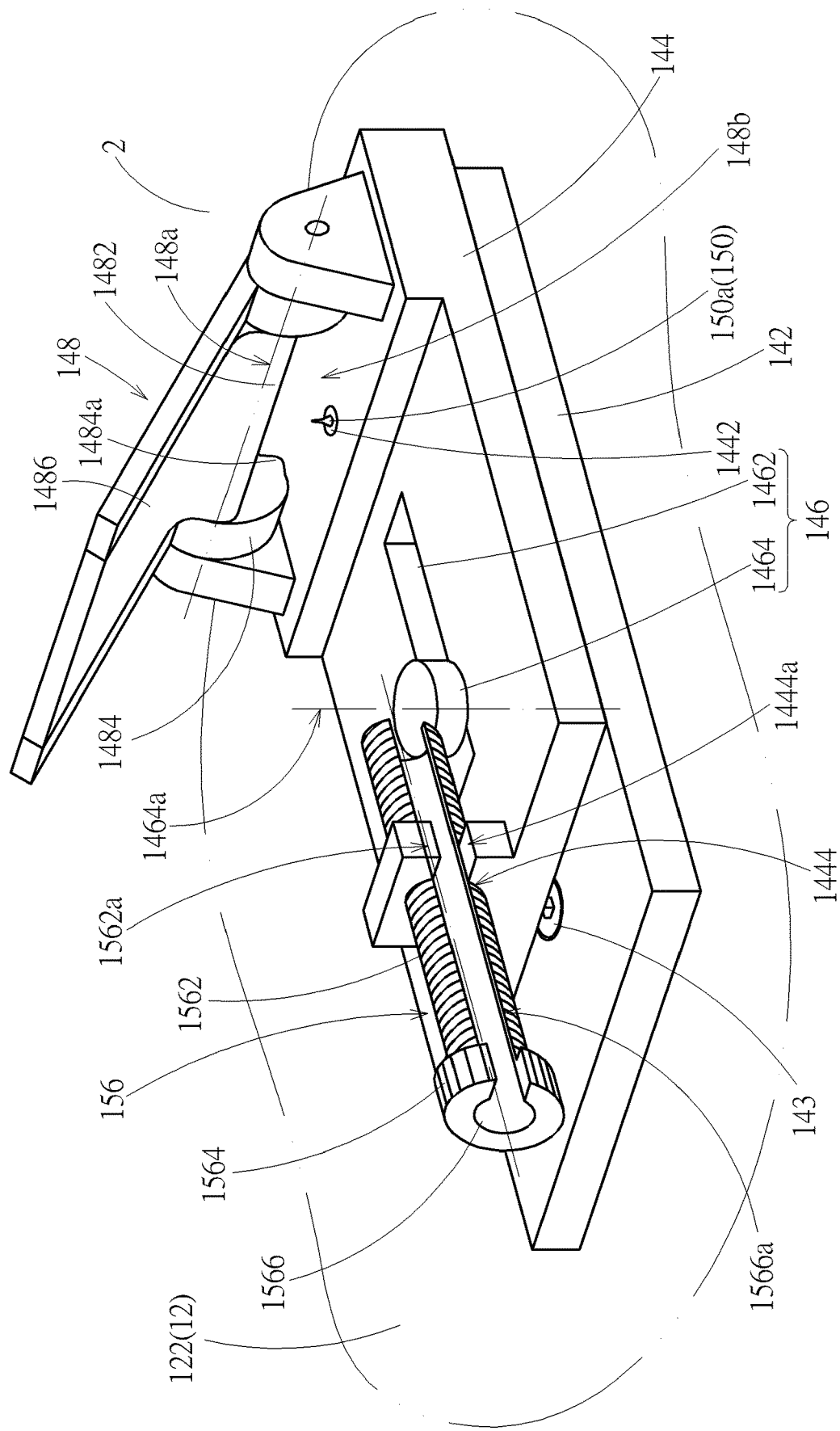
FIG. 10 is a schematic diagram illustrating the fixing device according to another embodiment.

In the embodiment, the fixing device 14 includes an adjusting part 156, which is connected to the movable part 144 or the fixed part 142. The adjusting part 156 is operable to change the relative position of the movable part 144 and the fixed part 142. As shown by FIG. 10, by manipulating the adjusting part 156, the movable part 144 can be move downward relative to the fixed part 142 so that the hang height of the apparatus body 12 decreases (relative to FIG. 6); when the adjusting part 156 is manipulated reversely, the hang height of the apparatus body 12 increases. The adjusting part 156 is adjustably connected to the movable part 144 or the fixed part 142 in a way of thread engagement. In the embodiment, the adjusting part 156 has an outer thread 1562. The movable part 144 has a second through hole 1444 correspondingly. The outer thread 1562 and the second through hole 1444 are engaged. An end of the adjusting part 156 abuts against the sliding part 1464. The relative position of the movable part 144 and the fixed part 142 can be changed by rotating the adjusting part 156 relative to the second through hole 1444 (or the movable part 144). In the above rotating, the adjusting part 156 can always maintain abutting against the sliding part 1464 stably. Furthermore, in the embodiment, the adjusting part 156 has a manipulation head 1564 for convenience for the user to rotate the adjusting part 156. The second through hole 1444 is provided with an inner thread for engaging with the outer thread 1562. However, in practice, the second through hole 1444 can be a through hole formed on a thin plate and engages with the outer thread 1562 by one pitch. This structural configuration also can make the position of the adjusting part 156 relative to the movable part 144 changed when the adjusting part 156 is rotated.

In the embodiment, because the sliding part 1464 is disposed on the fixed part 142, the adjusting part 156 is indirectly connected to the fixed part 142 through the adjusting part 156 abutting against the sliding part 1464. In practice, based on the embodiment, the fixed part 142 can include a structure (e.g. passing through a hollow structure of the sliding part 1464) protruding from the body of the fixed part 142 for the adjusting part 156 to abut against, so that the adjusting part 156 is directly connected to the fixed part 142. The two structural configurations can realize the connection of the adjusting part 156 and the fixed part 142 in logic. In addition, in practice, the adjusting part 156 can be changed to abut against the movable part 144; correspondingly, the outer thread 1562 of the adjusting part 156 is changed to engage with the fixed part 142 (or a through hole thereof). This structural configuration also can realize the above adjustment on the relative position of the movable part 144 and the fixed part 142. For another example, the adjusting part 156 is realized by a bolt and a nut engaged with the bolt. The bolt is fixed on one of the movable part 144 and the fixed part 142. The nut also abuts against the other one of the movable part 144 and the fixed part 142. The relative position of the movable part 144 and the fixed part 142 can be changed by rotating the nut relative to the bolt. The structure details for the variations of the adjusting part 156 can be obtained according to the embodiments in the foregoing and an actual situation that the fixing device 14 supports the weight of the apparatus body 12, which will not be described in addition. For another example, the adjusting part 156 is realized by other structure which can adjust the relative position of the movable part 144 and the fixed part 142. For example, a waved structure and a resilient part are oppositely disposed on the movable part 144 and the fixed part 142. By selectively engaging the resilient part with one trough of the waved structure; thereby, the relative position of the movable part 144 and the fixed part 142 is adjusted. In addition, in the embodiment, the adjustment on the relative position of the movable part 144 and the fixed part 142 is implemented by the manipulation of the adjusting part 156. However, in practice, if frictional force induced between the sliding part 1464 and the slot 1462 is sufficient, the adjusting part 156 can be omitted. For this case, it is practicable to directly make the movable part 144 and the fixed part 142 relatively move, and to maintain the relative position of the movable part 144 and the fixed part 142 through the frictional force.

Furthermore, in the embodiment, the adjusting part 156 has a first through hole 1566 that extends along a helix axis 1562a of the outer thread 1562 (indicated by a chain line in FIG. 3). The projection of the piercing structure 150a along the helix axis 1562a is located within the projection of the first through hole 1566 along the helix axis 1562a. Thereby, the electrical wire 2 can pass through the first through hole 1566 naturally, which will not structurally interfere with the clamping on the electrical wire 2 by the clamping part 148 and the movable part 144 (referring to FIG. 2 and FIG. 6). Furthermore, in the embodiment, the sliding part 1464 is substantially a cylinder, so the fixed part 142 and the movable part 144 can relatively rotate relative to a rotation axis 1464a (indicated by a chain line in FIG. 3) through the sliding part 1464. The helix axis 1562a and the rotation axis 1464a are located at a reference plane (i.e. an imaginary plane formed by the helix axis 1562a and the rotation axis 1464a). The reference plane passes through the piercing structure 150a. Thereby, after the movable part 144 is rotated relative to the sliding part 1464, the adjusting part 156 still can maintain abutting against the sliding part 1464, and the clamped electrical wire 2 still can pass through the first through hole 1566 naturally and support the apparatus body 12 through the fixing device 14. In addition, the movable part 144 can be changed to be realized by a slider and a post pivotally connected to the slider. The slider slides in the slot 1462. The post is fixed to the fixed part 142. This structural configuration also can make the movable part 144 be able to rotate relative to the fixed part 142; therein, the slider is not limited to a round post. Furthermore, in practice, if the electrical wire 2 has insufficient strength and length, the electrical wire 2 also can support a plurality of electronic displaying apparatuses 1 and provide power thereto. For example, as shown by FIG. 2, the electrical wire 2 continuously extends downward (e.g. exceeding the lower edge of the apparatus body 12). Another apparatus body 12 can be attached in series under the electronic displaying apparatus 1. Each apparatus body 12 can be disposed in different angles independently.

Furthermore, in practice, for convenience to dispose the electrical wire 2 into the first through hole 1566 of the adjusting part 156, each of the adjusting part 156 and the portion of the movable part 144 that engages with the adjusting part 156 forms a breach structure. As shown by FIG. 10, the first through hole 1566 of the adjusting part 156 has an open slot 1566a passing through the two ends of the first through hole 1566. The second through hole 1444 of the movable part 144 has a breach 1444a. The adjusting part 156 can rotate relative to the movable part 144, so as to align the open slot 1566a with the breach 1444a. At the same time, the electrical wire can pass through the breach 1444a and the open slot 1566a to get in or get out the first through hole 1566. Thereby, when the electrical wire 2 connects a plurality of electronic displaying apparatuses 1 in series, the user can install or replace one of the electronic displaying apparatuses 1 without dealing with the other electronic displaying apparatuses 1. In addition, in practice, the widths or gaps of the open slot 1566a and the breach 1444a are not limited to larger than or equal to the wire diameter of the electrical wire 2 (referring to FIG. 3). The electrical wire 2 has some elasticity or deformability in principle. When the widths or gaps of the open slot 1566a and the breach 1444a is slightly less than the wire diameter of the electrical wire 2, the user still can forcefully press the electrical wire 2 into the first through hole 1566. Furthermore, in practice, the open slot 1566a and the breach 1444a are not limited to parallel to the helix axis 1562a.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electronic displaying apparatus, connected with an electrical wire, the electronic displaying apparatus comprising:
   an apparatus body; and a fixing device, the fixing device piercing the electrical wire through a piercing structure and being fixed on the apparatus body, so that the apparatus body and the electrical wire are electrically connected.

2. The electronic displaying apparatus according to claim 1, wherein the fixing device comprises a fixed part, a movable part, an electrical input terminal, and an electrical output terminal, the movable part is slidably connected with the fixed part, the electrical input terminal is disposed on the movable part and comprises the piercing structure, the electrical input terminal is electrically connected with the electrical wire through the piercing structure, and the electrical output terminal is disposed on the fixed part and is electrically connected with the electrical input terminal.

3. The electronic displaying apparatus according to claim 2, wherein the movable part and the fixed part are slidably connected through a connecting mechanism, the connecting mechanism comprises a slot and a sliding part slidably disposed on the slot, the slot is disposed on one of the fixed part and the movable part, and the sliding part is disposed on the other one of the fixed part and the movable part.

4. The electronic displaying apparatus according to claim 3, wherein the fixed part and the movable part are relatively rotatable through the sliding part.

5. The electronic displaying apparatus according to claim 3, wherein the slot is disposed on the movable part, the sliding part is disposed on the fixed part, the sliding part electrically contacts the slot, and the electrical input terminal is electrically connected to the electrical output terminal through the slot, the sliding part, and the fixed part.

6. The electronic displaying apparatus according to claim 3, wherein the slot is disposed on the movable part, the sliding part is disposed on the fixed part, the connecting mechanism further comprises a conductive resilient strip disposed on the slot, the sliding part electrically and slidably contacts the conductive resilient strip, the electrical input terminal is electrically connected to the electrical output terminal through the conductive resilient strip, the sliding part, and the fixed part.

7. The electronic displaying apparatus according to claim 2, wherein the fixing device comprises a clamping part pivotally connected with the movable part and having a pressing surface, the pressing surface faces the movable part, and the piercing structure faces the pressing surface.

8. The electronic displaying apparatus according to claim 7, wherein the piercing structure comprises a conductive pointed end or a cutting edge protruding out the movable part toward the pressing surface.

9. The electronic displaying apparatus according to claim 7, wherein the movable part has a depression toward the pressing surface, and the piercing structure is disposed in the depression.

10. The electronic displaying apparatus according to claim 7, wherein the clamping part comprises a pivotal portion and a manipulation portion connected with the pivotal portion, the clamping part is pivotally connected to the movable part relative to a pivotal axis through the pivotal portion, and the pressing surface is located on the manipulation portion and protrudes toward the piercing structure.

11. The electronic displaying apparatus according to claim 10, wherein the pivotal portion has a protruding portion protruding perpendicular to the pivotal axis.

12. The electronic displaying apparatus according to claim 7, wherein the pressing surface has a plurality of protrusions or notches.

13. The electronic displaying apparatus according to claim 2, wherein the fixing device comprises an adjusting part connected to the movable part or the fixed part, and the adjusting part is operable to change a relative position of the movable part and the fixed part.

14. The electronic displaying apparatus according to claim 13, wherein the adjusting part is adjustably connected with the movable part or the fixed part in a way of thread engagement.

15. The electronic displaying apparatus according to claim 13, wherein the adjusting part has an outer thread and a first through hole, the outer thread has a helix axis, the first through hole extends along the helix axis, and the adjusting part is adjustably connected with the movable part or the fixed part through the outer thread.

16. The electronic displaying apparatus according to claim 15, wherein the movable part and the fixed part are slidably connected through a connecting mechanism, the connecting mechanism comprises a slot and a sliding part slidably disposed on the slot, the slot is disposed on one of the fixed part and the movable part, the sliding part is disposed on the other one of the fixed part and the movable part, the fixed part and the movable part are rotatable relative to a rotation axis through the sliding part, and the adjusting part abuts against the sliding part.

17. The electronic displaying apparatus according to claim 15, wherein the first through hole has an open slot passing through two ends of the first through hole, the movable part or the fixed part has a second through hole correspondingly, the second through hole has a breach, and the adjusting part is engaged with the second through hole through the outer thread so as to be adjustably connected with the movable part or the fixed part.

18. The electronic displaying apparatus according to claim 2, further comprising an insulation pad disposed between the fixed part and the apparatus body.

19. The electronic displaying apparatus according to claim 1, wherein the apparatus body comprises a display screen, the fixing device is located at a back side of the apparatus body, and the display screen is located at a front side of the apparatus body.

20. A fixing structure used for an electronic displaying apparatus, the fixing structure being connected with an electrical wire and comprising:

a fixing device, the fixing device piercing the electrical wire through a piercing structure and being fixed on the electronic displaying apparatus, so that the electronic displaying apparatus and the electrical wire are electrically connected.

* * * * *